United States Patent [19]

Finkbeiner et al.

[11] 3,962,002

[45] June 8, 1976

[54] METHOD FOR MAKING COMB ELECTRODE FOR ELECTRICAL RECORDING APPARATUS

[75] Inventors: Ludwig Finkbeiner, Walheim; Hans-Christoph du Mont, Renningen, Malmsheim; Kurt Hurst; Manfred Köder, both of Stuttgart, all of Germany

[73] Assignee: Robert Bosch G.m.b.H., Gerlingen-Schillerhohe, Germany

[22] Filed: Sept. 25, 1974

[21] Appl. No.: 509,245

[30] Foreign Application Priority Data
Oct. 5, 1973 Germany............................ 2350026

[52] U.S. Cl............................. 156/3; 96/36.2; 156/6; 156/11; 156/18
[51] Int. Cl.²............................................ C23F 1/02
[58] Field of Search.......... 317/101; 346/14, 139 A, 346/139 R, 139 C; 156/3, 8, 11, 18, 6; 96/36.1, 36.2; 29/625

[56] References Cited
UNITED STATES PATENTS

| | | | |
|---|---|---|---|
| 3,413,647 | 11/1968 | Polster et al. | 346/14 |
| 3,415,699 | 12/1968 | Brown | 156/11 X |
| 3,537,175 | 11/1970 | Clair et al. | 156/3 X |
| 3,539,259 | 11/1970 | Hillman et al. | 156/11 X |
| 3,647,584 | 3/1972 | Duffy | 96/36.2 X |
| 3,747,202 | 7/1973 | Jordan | 29/577 |
| 3,771,634 | 11/1973 | Lamb | 346/139 A |

*Primary Examiner*—William A. Powell
*Attorney, Agent, or Firm*—Flynn and Frishauf

[57] ABSTRACT

A thin sheet of metal is first etched in accordance with similar patterns after exposure through masks, from both sides, to form parallel strips which, preferably, extend to integral connecting elements and may, also, include printed circuit connections or components; one of the sides of the strips, additionally, includes transverse cross connections to provide for mechanical attachment of the parallel strips, permitting application of the parallel strips to a substrate, for subsequent removal, so that the resulting electrode will be a plurality of closely spaced parallel strips applied, for example by an adhesive, on a substrate, integral with connecting portions for a printed circuit.

14 Claims, 11 Drawing Figures

METHOD FOR MAKING COMB ELECTRODE FOR ELECTRICAL RECORDING APPARATUS

The present invention relates to electrical recording apparatus and more particularly to comb electrodes in which parallel conductive strips are provided which can be energized, selectively, to apply current to selected positions on a metallized recording paper, for example to make burn marks, the electrodes being isolated from each other, and to a method of making such electrodes.

Comb-type electrodes which are used for analog recording on strip recorders or the like, using metallized recording paper, are usually made from thin sheet metal strips, or by wire wound technology. If flat strips are used, the sheet metal strips are usually cut, punched, or milled. The resulting electrodes can be used for analog recording, as well as to generate alphanumeric characters on metallized recording paper, or similar record carriers. A difficult problem arises in the connection of electrodes made when sheet metal strips or wound wires are cut. Each one of the electrodes must be separately connected, so as to be capable of separate current energization. This requires a large number of connecting lines, as well as of electrodes, per unit area, and particularly per unit linear length transverse to the electrodes.

It is an object of the present invention to provide an electrode, and particularly a method to make such an electrode which is inexpensive, highly efficient, and readily permits manufacture of comb-type multiple parallel electrodes.

SUBJECT MATTER OF THE PRESENT INVENTION

Briefly, the electrode arrangement is made by photographic process, by exposure of a sheet metal element, preferably springy, through a mask, which sheet metal element is then selectively etched. Two masks are used, which are essentially similar, to generate strip-like electrodes between which material is to be removed. The masks are applied to opposite faces of the sheet metal element. One of the masks, besides masking those areas where the electrodes are to remain, additionally provides for cross, or connecting portions, so that the electrode made after preliminary etching will be a connected comb, to form a sub-assembly which is form-stable and can be applied to a substrate, for example by adhesives. In a further step, the cross connecting portions are then removed, either mechanically or by additional etching. Thus, closely spaced electrodes can readily be made, and applied to a substrate, without danger of deformation during the application step.

A photographic negative process is particularly preferred, utilizing a photo-resist lacquer which is hardened by polymerization in those areas where the mask is transparent, that is, where light passes through the mask. This process is efficient, and inexpensive, and permits exact shaping with sharply defined edges. The reverse may, of course, be used and while the specification hereafter is addressed to the currently preferred method, it is to be understood that the reverse (a photo-positive process) is within the scope of the inventive concept.

Various materials are suitable for the sheet metal element; for example, spring steel, chrome nickel steel, and copper-beryllium alloys are suitable. The photo masks for the top side and bottom side of the electrode arrangement are preferably so made that they are connected along a longitudinal edge; if of a plastic material, this edge may be a "living hinge", to form a pocket or folder within which the sheet metal to be exposed, and subsequently etched is then received. Connecting the masks together, arranged for folding towards each other with the metal to be etched therebetween reliably ensures registration of the two masks, without expensive separate alignment of one mask with respect to the other.

In accordance with a feature of the invention which simplifies the manufacturing process, the cross connecting portions are located between contact portions of the electrodes and a connecting bridge which afterwards is removed. The terminal ends of the electrodes which, later, are adapted to form the writing tips thereof preferably are also connected during the etching step; this connecting portion, likewise, is removed after at least the first etch. Connecting portions which are located longitudinally beyond the actual electrodes can then, later, be removed by simple mechanical cutting, to sever the various electrodes into individually connectable units.

The arrangement can be mechanically stabilized during production also by placing the connecting bridges between the various electrodes and the contact portions of the electrodes, or between the contact portions themselves. The masks for the top side and for the bottom side are then made differently, only one of the masks having transparent areas corresponding to the crossing, connecting bridges, and the etching step is carried out in such a way that the sheet metal element is etched only to half the thickness. This sub-assembly is then placed on a carrier and, upon later removal of the cross bridges, the already half-etched cross bridges provide lesser resistance to mechanical or chemical (etching) removal, thus speeding the entire process.

The invention will be described by way of example with reference to the accompanying drawings, wherein.

A strip-like sheet metal element 10 (FIG. 1) is coated at both the top as well as the bottom side by photo-resist coatings 11, 12, which may be a commercial type of photo-sensitive lacquer. Masks 13, 14 are applied to the top side and bottom side, respectively, and placed against the respective photo-resist layers 11, 12.

Figure 1:
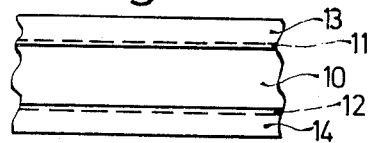
FIG. 1 is a schematic end view of a sheet metal element to be etched, and covered with a photo-resist layer, on both sides, as well as by masks on both sides.

The arrangement of FIG. 1 is used to make a multiple comb electrode as used, for example, in strip recorders for use with metallized recording paper. To make the electrode arrangement, it is necessary that the various comb electrode elements are mechanically reliably located with respect to each other, and mechanically stabilized. Masks 13, 14 (FIGS. 2a, 2b) are therefore applied to both sides of the sheet 10 which is coated with the photo-resist layers 11, 12, and then exposed. At the transparent areas, that is, those areas at which the photo masks 13, 14 are transparent rather than opaque, the light causes polymerization of the photo resist. The photo resist is developed, and in those areas where light struck the photo-resist layer, a bath into which the sheet 10 is immersed will not be able to dissolve the photo resist. Thus, a subsequent etching step can be used to etch away those portions of the metal 10 which were not exposed, that is, which were beneath the opaque regions of the masks 13, 14, respectively. The exposure, polymerization developing and etching steps, by themselves, are well known; the photographic process will be described in detail.

Usually, due to the relatively low price, the sheet metal 10 will be ordinary sheet spring steel. Chrome-nickel steel and copper beryllium alloys are also eminently suitable for the sheet metal element 10, to form the base material to make the multiple electrode arrangement.

Figure 8:
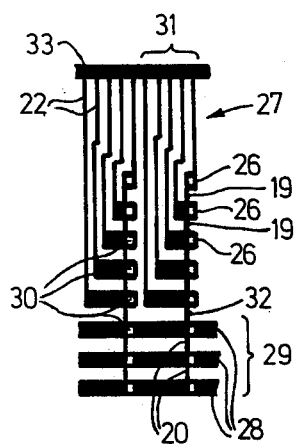
FIG. 8 is a highly schematic top view, to a greatly reduced scale, of a comb electrode with connecting bridges between the contact portions.

The negative-type photo mask 13 (FIG. 2a) is formed, at its upper portion, with four transverse transparent strips generally shown at 15, the top strip being shown at 15a, and three intermediate cross strips being shown at 15b, 15c and 15d, respectively. The central portion of the mask is formed with transparent regions 16, and the lower portion of the mask has transparent regions 17. Only a few of the transparent portions 16, 17 have been given reference numerals for clarity of the drawing. Upon exposure, the photo resist will polymerize, or become immune to subsequent dissolution in a wash bath; upon subsequent etching, the sheet 10 will remain unaffected where light struck the sheet. Thus, the transparent zones 15 will result in cross bridges 18 (FIG. 3); the regions 16 will form connecting elements 19 (FIG. 8) and the transparent regions 17 will form connecting bridges 20 (FIG. 8). The connecting bridges 20 are located between separate conductors of a printed circuit which can be made of the sheet metal element 10 together, and simultaneously, when the electrode arrangement, and the contact portions thereof are made. The metallic connections are shown, schematically, and for illustration only in FIG. 8. The masks may be of various types; the transparent regions 15, 16, 17 may be transparent or translucent portions in a glass plate, in a transparent plastic foil, or the like.

Figure 2A:
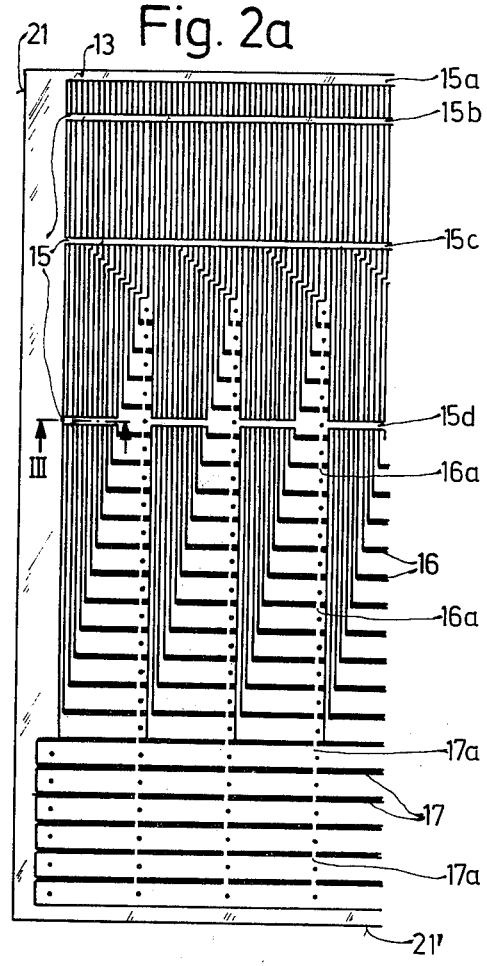
FIG. 2a is a top view of a negative-type photo mask for the top side of the sheet element for use in a first etching step.
Figure 2B:
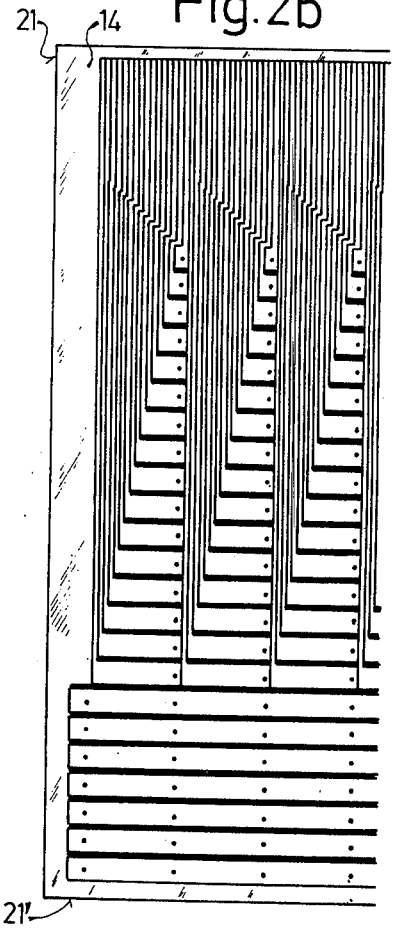
FIG. 2b is a bottom view of a negative-type photo mask for the bottom side of the sheet metal, to be used for a first etching step.

The negative-type photo mask 14 for the bottom side (FIG. 2b) is generally similar to the photo mask 13 of FIG. 2a; it does not, however, have transparent areas at those positions which correspond to the mask of FIG. 2a, in which sheet metal material should remain upon etching. Thus, the photo masks 13 and 14 for the top side and bottom side, respectively, differ from each other in that photo mask 14 does not have transparent areas for connecting portions which later on will form connecting bridges, specifically it does not have the transparent areas 15, 16a, 17a (FIG. 2a). In all other respects, that is, in the alignment of the electrodes, the connecting portions and the printed circuit portions, the masks are similar. To obtain perfect registration of the electrode transparent areas of masks 13 and 14 with respect to each other, the masks are hinged along a longitudinal edge, for example along edge 21 (FIGS. 2a, 2b) in form of a folder, to form a pocket into which the sheet metal element 10 can be inserted. If desired, the masks may additionally be connected, or removably connectable, for example by means of a sliding clamp, at one of the other transverse edges, for example the lower edge 21'.

Figure 3:
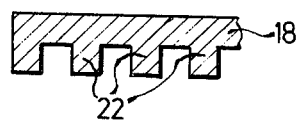
FIG. 3 is a highly enlarged fragmentary cross section, along line III—III of FIG. 2a, illustrating a connecting bridge portion.

After exposure and developing (by washing away the unexposed photo resist) the sheet metal element 10 is etched. Etching is done to half-thickness of sheet 10. FIG. 3 shows a fragment of the cross section along section III—III in FIG. 2a, after the first etching step. The transparent area 15d permitted the photo resist therebeneath to polymerize so that a cross bridge 18 will be formed, since no sheet material has been removed beneath the polymerized resist exposed through the transparent zone 15d. The bottom side of the sheet metal 10 is, however, already completely etched corresponding to the comb electrode, as seen in FIG. 3.

The multiple electrode arrangement is then adhered to a carrier 23, for example by an epoxy adhesive layer 24, which also penetrates within the interstices between the comb electrode elements 22. The carrier 23, for example, is an epoxy saturated fiberglass plate.

Figure 4:
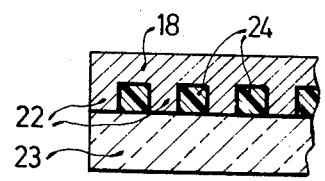
FIG. 4 is a fragmentary view of the portion of FIG. 3 applied, by adhesion, to a carrier substrate.
Figure 5:
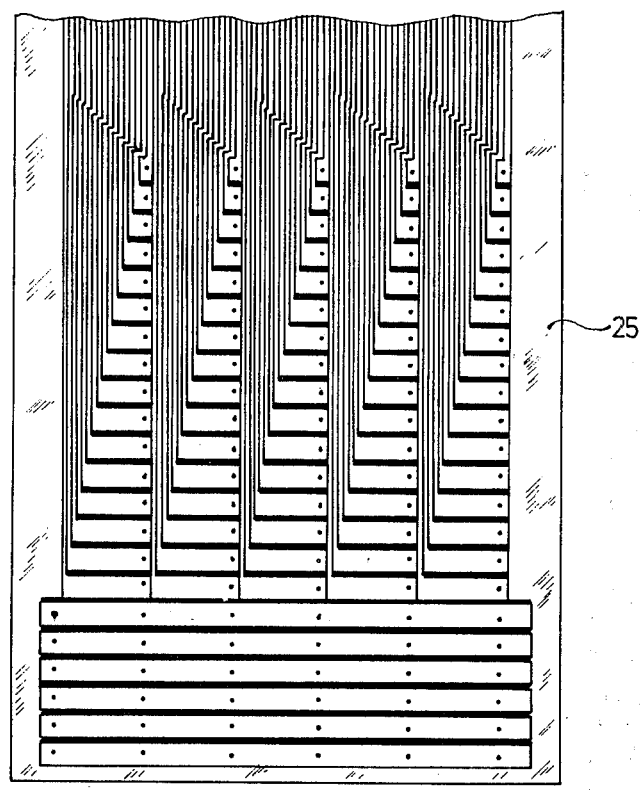
FIG. 5 is a top view of a negative-type photo mask for the top side of the sheet for exposure prior to a second etching step to remove connecting bridges.
Figure 6:
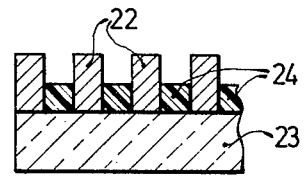
FIG. 6 is a fragmentary cross-sectional view, to a greatly enlarged scale, corresponding to FIG. 4, after removal of the connecting bridge, by etching, or mechanical removal (for example by grinding)

A negative-type photo mask 25 (FIG. 5) is then applied to the top side of the electrode, in order to permit removal of the cross bridges 18, 19, 20 which were left, corresponding to the transparent areas 15, 16, 17 in photo masks 13 of FIG. 2a. The photo resist at the top surface of the layer of FIG. 4 is entirely removed by a suitable solvent, as well known in the etching field, and a new photo-resist layer is applied thereto. Photo mask 25, properly aligned, is then placed on the sub-assembly of FIG. 4 which is then exposed. Again, the exposed portions will harden the photo resist so that, in a subsequent developing bath, the metal beneath the transparent areas will be coated, the metal beneath the opaque areas, however, being exposed so that it can be removed in a further etching step. Upon this additional etching step, therefore, a protective photo resist layer will cover only the region of the electrodes 22; the cross bridges 18, 19, 20, which remained after the first etching step, are removed. The mask of FIG. 5 may be similar to the mask 14 of FIG. 2b. The result will be an electrode arrangement as seen in the cross sectional fragment of FIG. 6, in which the electrodes 22 are spaced from each other by the intervening, penetrating adhesive 24, and are, in turn, securely adhered to the substrate 23.

Figure 7:
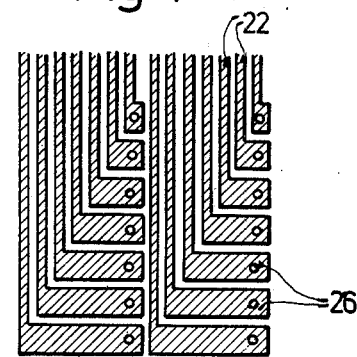
FIG. 7 is a fragmentary top view showing the contact portions of a multiple electrode.

FIG. 7 is an enlarged view of a portion of the electrode arrangement; each electrode 22 has an associated contact region or zone 26 which, like the various electrodes, is electrically insulated with respect to the adjacent contacting portion; as can readily be seen, the type of contact arrangement possible is emanently suitable for connection to a printed circuit.

The connecting bridges 18, 19, 20 need not be removed in the second photo resist-exposure-etching step. The connecting bridges may, also, be mechanically removed after the sub-assembly of FIG. 3 has been adhered to the carrier substrate 23, that is, the electrode array on its substrate 23 of FIG. 4 is subjected to mechanical processing. Removal of the connecting bridges 18, 19, 20, for example by grinding, is simpler than a second etch; it can be used, however, under economic conditions only if the electrode arrangement and the contact arrangement are comparatively simple, so that no complicated grinding, or punching paths will result. The end connecting bridges formed, for example, under the transparent area 15a (FIG. 2a) can be severed from the electrode by cutting or punching.

A sub-assembly of an electrode array (with substrate omitted for clarity) is seen in FIG. 8. A comb electrode 27 has connecting bridges 19 between the contact regions 26; connecting bridges 20 between printed circuit connecting conductors 28 of a printed circuit 29, and a cross connecting bridge, forming a holding bridge 33 at the electrode terminal ends of the electrodes 22. The electrodes themselves are sub-divided into sub-groups, such as group 31. An additional connecting strip 32 is provided between the lowest contacting portion 26 of the electrodes 22, and the adjacent conductor 28 of the printed circuit 29. Connecting bridges 19, 20 and 32 are removed mechanically, or by etching, as above described, after adhering the electrode assembly of FIG. 8 to the substrate or carrier 23 (FIG. 4). The connecting bridge 33 at the writing-ends of the electrodes 22 also stabilizes the electrode array against distortion or relative shift, during manufacture. This connecting bridge 33, likewise, is severed after adhering the electrode assembly 27 on the substrate 23 (FIG. 4), for example by etching, as above discussed, or by grinding; the substrate may, also, be slightly shorter and the bridge 33 can then be severed by cutting or punching.

Some recorders require a large number of electrodes 22 which are to be located very closely to each other. The thickness of the sheet metal 10 may, therefore, not exceed a certain limit since, otherwise, edges between the respective electrodes 22 and which arise upon etching may project too far, so that, for reliable operation, a necessary minimum distance can no longer be maintained. In actual practice, the distance between electrodes should not be less than the thickness of the sheet element 10. A suitable thickness for the sheet element 10 is about 0.25 mm; thus, two electrodes, per millimeter width of the comb, can be fitted in the array. If the material thickness is decreased, for example to 0.125 mm. four electrodes can be placed for each millimeter width of comb; if such thin material is used or if even thinner material is to be used, the operating use time of the electrode array can be increased if the electrodes are made slightly thicker in the region of their writing terminal ends, for example by strengthening the electrode structure by diffusion soldering.

Figure 9:
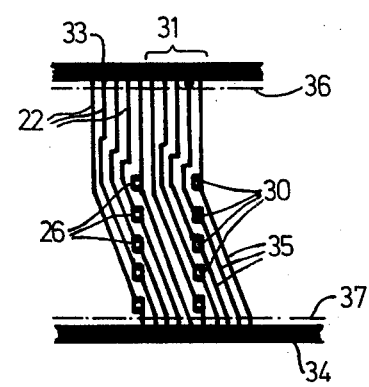
FIG. 9 is a top view of a multiple comb electrode with inclined connecting portions and with connecting bridges at both ends of the electrode arrangement.

FIG. 9 illustrates a multiple electrode array, as a sub-assembly, before the cross bridge 33, adjacent the writing terminal ends of the electrodes 22, has been removed. A further cross bridge 34 is provided at the contact end of the electrodes 22. The array of FIG. 9 differs from that previously disclosed in that inclined connecting strips 35 are provided which extend, at an inclination, between the electrode contact zones 26 and the terminal cross bridge 34 which is to be removed after the electrodes themselves have been formed by etching. The connecting strips 35, themselves, need not be removed; they may remain on the substrate after the cross bridges 33 and 34 have been removed, for example by cutting along severing lines 36, 37. This arrangement substantially simplifies the manufacturing process since a second etching step using the mask of FIG. 5 would not be needed, and the masks used to provide for exposure of the coated sheet metal, from which the comb electrodes are made, may be similar. The arrangement is, however, less stable transverse to the major extent of the electrodes 22 during manufacture.

Figure 10:
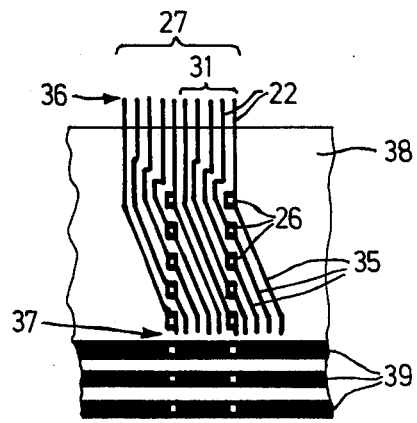
FIG. 10 is a top view of a multiple comb electrode secured to a carrier with a printed circuit, to a reduced scale.

FIG. 10 illustrates application of an electrode array 27 on a carrier substrate 38 which, previously, had a printed circuit 39 applied thereto. An electrode array similar to that of FIG. 9 is applied to carrier substrate 38, with printed circuit 39 thereon, and the connecting bridges 33, 34 removed at 36, 37, corresponding to the severing lines 36, 37, FIG. 9.

The electrodes of the present invention can be readily made, simply, of usually used materials by suitable etching, the electrodes themselves being adhered to a carrier which, simultaneously, can form a carrier for a printed circuit for connection to the electrodes, which printed circuit can be made simultaneously during manufacture of the electrodes. Suitable electrode connections to the printed circuit may also be provided by the photo masks, and selectively removed (or not) in accordance with circuit requirements.

The cross connections, that is, the cross bridges 18 (FIGS. 3, 4), 19, 20, 33, 34 (FIGS. 8, 9) are severed only after the entire comb electrode is adhered to the substrate. To make contacts or connections, the electrode comb is formed at its end portions with suitable openings (such as the terminal ends 26, 30, FIG. 9) which match similar openings in the carrier plate. Contact pins can then be inserted, for example from beneath, to fit through the openings in the electrode connection elements. The pins are then soldered from the top to the respective contact portion. After forming the connection to the connection pins, the cross bridges, or longitudinal connections are then severed by grinding, or cutting, for example on a punching tool. Similar connections may, of course, be made to the printed circuit conductors 39 (FIG. 10) on the same board, at the same time.

Various changes and modifications may be made, and features described in connection with any one embodiment may likewise be used with any other, within the inventive concept.

We claim:
1. Method to make a comb electrode array for electric recording apparatus, particularly for use with metallizing strip recording media, to provide closely spaced elongated conductive strip electrodes (22), insulated from each other by an insulating gap and having a recording terminal end portion (22), the other end portion being formed as a connecting portion (26) for connection to an external circuit, the steps of providing a thin sheet of springy, hard sheet metal (10);

coating the sheet metal on both surfaces with a photosensitive layer (11,12);

providing a first mask (13) having transparent areas corresponding to the electrode configuration and, in addition, having transparent areas (15, 16, 17) crossing said electrode configuration, the additional crossing transparent areas being located between said end portions to place the connecting portions (18, 19) between said end portions (22, 26) of the electrodes;

providing a second mask (14) at least having transparent areas corresponding to the electrode configuration;

applying the first mask (13) to one side of the sheet;

applying the other mask (14) to the other side of the sheet;

exposing both sides of the sheet through the respective mask, and developing the sides of the sheet by polymerizing those portions of the photo-sensitive layers which were beneath transparent areas of the mask and removing the photo-sensitive layer portions which were under opaque areas of the mask;

etching both sides of the developed sheet, the additional transparent areas thereby leaving connecting bridge portions (18, 19, 20; 33, 34) between the electrodes to provide for a mechanically stable sub-assembly suitable for further handling;

adhering the attached electrode sub-assembly array on a carrier substrate (23, 28) located against the side adjacent the second mask; and removing the connecting portions (18, 19, 20; 33, 34) after the sub-assembly has been adhered to said carrier substrate (23, 28).

2. Method according to claim 1, wherein the sheet metal is spring steel.

3. Method according to claim 1, wherein the sheet metal is chrome-nickel steel.

4. Method according to claim 1, wherein the sheet metal is a copper-beryllium alloy.

5. Method according to claim 1, wherein the etching step is carried out from the side adjacent the second mask and to the half thickness of the sheet.

6. Method according to claim 1, wherein the removal step comprises etching.

7. Method according to claim 1, wherein the removal step comprises mechanical removal including at least one of: abrasion; cutting.

8. Method according to claim 1, wherein the first and second masks are essentially rectangular sheet-like and flat and are connected at one lateral side (21) by a hinge to form a mask structure which can be folded for insertion of the thin sheet of sheet metal (10) therebetween to assure accurate registration of the masks at both sides of the sheet.

9. Method according to claim 1, further comprising the step of reinforcing the electrodes (22) at the electrode ends by providing a reinforcing electrode structure by diffusion soldering.

10. Method according to claim 1,
wherein the additional cross transparent areas are located adjacent the terminal ends of the connecting strips (35) to form an end connecting bridge (34);

and the removal step comprises the step of removing said bridge (34) after the etching step.

11. Method according to claim 8,
wherein the additional crossing transparent areas are located adjacent the terminal end portion (22) to form an end connecting bridge (33);

and the method further comprises the step of removing said bridge (33) after the etching step.

12. Method according to claim 1, further comprising the steps of: providing the carrier plate (38) with a printed circuit (39) thereon.

13. Method according to claim 1, further comprising the steps of providing the carrier plate (38) with a printed circuit (39) thereon; and the adhering step comprises adhering the etched electrode array on the side of said carrier plate (38) which has the printed circuit thereon.

14. Method according to claim 1, wherein said masks additionally carry masking regions forming a printed circuit;

and wherein said additional transparent areas include regions crossing said printed circuit and connecting, mechanically, said printed circuit to said electrode array configuration, whereby, during the etching step, the electrode array and the printed circuit are simultaneously generated.

* * * * *